US011961640B2

(12) United States Patent
Bae et al.

(10) Patent No.: US 11,961,640 B2
(45) Date of Patent: Apr. 16, 2024

(54) FLEXIBLE FLAT CABLE AND METHOD FOR MANUFACTURING THE SAME

(71) Applicant: Samsung Electronics Co., Ltd., Suwon-si (KR)

(72) Inventors: Bumhee Bae, Suwon-si (KR); Junghwan Yeom, Suwon-si (KR); Changwon Jang, Suwon-si (KR); Jeongnam Cheon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 650 days.

(21) Appl. No.: 16/970,275

(22) PCT Filed: Jul. 15, 2020

(86) PCT No.: PCT/KR2020/009282
§ 371 (c)(1),
(2) Date: Aug. 14, 2020

(87) PCT Pub. No.: WO2021/015479
PCT Pub. Date: Jan. 28, 2021

(65) Prior Publication Data
US 2023/0154645 A1    May 18, 2023

(30) Foreign Application Priority Data
Jul. 25, 2019   (KR) ........................ 10-2019-0089974

(51) Int. Cl.
*H01B 7/00*    (2006.01)
*H01B 7/08*    (2006.01)
*H01B 11/20*   (2006.01)

(52) U.S. Cl.
CPC ............. *H01B 7/08* (2013.01); *H01B 11/203* (2013.01)

(58) Field of Classification Search
CPC ................................. H01B 7/08; H01B 11/203
See application file for complete search history.

(56) References Cited

U.S. PATENT DOCUMENTS 10,651,526 B2    5/2020   Bae et al.
2005/0200557 A1*  9/2005   Tanaka ................... H01Q 9/285
                                                      343/904

(Continued)

FOREIGN PATENT DOCUMENTS

EP    1758133 A1 *  2/2007   ........... H01B 7/0861
JP    3564053 B2     9/2004

(Continued)

OTHER PUBLICATIONS

JP 2020136158A English Translation ; filed on Feb. 22, 2019 (Year: 2019).*

(Continued)

*Primary Examiner* — Pete T Lee
(74) *Attorney, Agent, or Firm* — Jefferson IP Law, LLP

(57) ABSTRACT

A flexible flat cable according to various embodiments of the disclosure may include a first insulation layer having a plate shape, a first conductive pattern disposed on the first insulation layer, a second conductive pattern disposed on the first insulation layer to be spaced apart from the first conductive pattern at a predetermined interval, a second insulation layer covering at least a portion of the first conductive pattern and disposed on the first insulation layer to cover the first conductive pattern, a first shield member including a first shield layer disposed on the first insulation layer and the second insulation layer to cover the first conductive pattern and the second conductive pattern, and a second shield layer disposed on the first shield layer to cover the first shield layer, and a third insulation layer surrounding the first shield layer such that at least a portion of the first shield layer of (Continued)

the first shield member, which is exposed between the first insulation layer and the second shield layer of the first shield member is covered.

10 Claims, 13 Drawing Sheets

(56) References Cited

U.S. PATENT DOCUMENTS

| | | | |
|---|---|---|---|
| 2007/0193770 A1 | 8/2007 | Ueno et al. | |
| 2008/0236868 A1* | 10/2008 | Koga | H01B 7/0861 |
| | | | 439/493 |
| 2009/0000804 A1* | 1/2009 | Kobayashi | H01P 3/08 |
| | | | 174/117 F |
| 2014/0102763 A1* | 4/2014 | Lin | H05K 3/4691 |
| | | | 174/250 |
| 2015/0034364 A1 | 2/2015 | Ho et al. | |
| 2016/0078983 A1 | 3/2016 | Gundel et al. | |
| 2016/0174304 A1 | 6/2016 | Kim et al. | |
| 2018/0053981 A1 | 2/2018 | Bae et al. | |
| 2020/0028949 A1 | 1/2020 | Kim et al. | |

FOREIGN PATENT DOCUMENTS

| | | |
|---|---|---|
| JP | 2008-041451 A | 2/2008 |
| JP | 2015-032833 A | 2/2015 |
| KR | 10-2007-0038025 A | 4/2007 |
| KR | 10-2018-0010525 A | 1/2018 |
| KR | 10-2018-0019472 A | 2/2018 |
| KR | 10-1869669 B1 | 6/2018 |
| KR | 10-2019-0072915 A | 6/2019 |
| KR | 10-2020-0009251 A | 1/2020 |

OTHER PUBLICATIONS

European Search Report dated May 4, 2022, issued in European Application No. 20845087.4.
International Search Report dated Oct. 22, 2020, issued in International Application No. PCT/KR2020/009282.
European Office Action dated Oct. 10, 2023, issued in European Application No. 20845087.4.
Korean Office Action dated Feb. 28, 2024, issued in Korean Application No. 10-2019-0089974.

* cited by examiner

FLEXIBLE FLAT CABLE AND METHOD FOR MANUFACTURING THE SAME

TECHNICAL FIELD

The disclosure relates to a flexible flat cable and a method for manufacturing the flexible flat cable.

BACKGROUND ART

Electronic devices, such as smartphones, tablet PCs, and computers have been miniaturized, made slimmer, and equipped with multiple functions.

An electronic device may be used by mounting or connecting various electronic components, such as a processor, a memory, a speaker, a microphone, a sensor, a camera, an antenna, and/or a communication module on or to a printed circuit board (PCB) through a flexible printed circuit board (FPCB).

The PCB or the FPCB may include a cable that connects the above-described electronic components.

DISCLOSURE OF INVENTION

Technical Problem

The cables used for electronic devices are becoming thinner, and requests for shielding electromagnetic interferences (EMIs) of the electronic devices are increasing.

In order to satisfy the requests, a flexible flat cable EMI shielding layer may be included. The process of manufacturing a flexible flat cable includes a process of cutting a shape of the flexible flat cable. Then, a cross-section of the EMI shielding layer is exposed to the outside.

The EMI shielding layer may include a conductive material, and when a cross-section of the EMI shielding layer is exposed to the outside, the conductive material may be exposed to the outside. Accordingly, a short-circuit may be caused between an electronic component and a conductive material that are adjacent to the flexible flat cable. According to occasions, the conductive material of the EMI shielding layer exposed to the outside may be corroded.

Various embodiments of the disclosure provide a flexible flat cable having a structure that can solve the above-described problems by preventing a conductive material of an EMI shielding layer from being exposed to the outside, and a method for manufacturing the same.

Solution to Problem

A flexible flat cable according to various embodiments of the disclosure may include a first insulation layer having a plate shape, a first conductive pattern disposed on the first insulation layer, a second conductive pattern disposed on the first insulation layer to be spaced apart from the first conductive pattern at a predetermined interval, a second insulation layer covering at least a portion of the first conductive pattern and disposed on the first insulation layer to cover the second conductive pattern, a first shield member including a first shield layer disposed on the first insulation layer and the second insulation layer to cover the first conductive pattern and the second conductive pattern, and a second shield layer disposed on the first shield layer to cover the first shield layer, and a third insulation layer surrounding the first shield member such that at least a portion of the first shield layer of the first shield member, which is exposed between the first insulation layer and the second shield layer of the first shield member, is covered.

A method of manufacturing a flexible flat cable according to various embodiments of the disclosure may include pattering at least one first conductive pattern and at least one second conductive pattern on a first insulation layer having a plate shape, disposing a second insulation layer on the first insulation layer such that at least a portion of the at least one first conductive pattern and the second conductive pattern are covered, disposing the first shield member on the first insulation layer and the second insulation layer such that a first shield member including a first shield layer and a second shield layer covers the at least one first conductive pattern and the second insulation layer, disposing a third insulation layer on the first shield member and the first insulation layer such that at least a portion of the first shield layer of the first shield member, which is exposed between the first insulation layer and the second shield layer of the first shield member is covered, and cutting an outer shape of the flexible flat cable.

Various respective aspects and features of the invention are defined in the appended claims. Combinations of features from the dependent claims may be combined with features of the independent claims as appropriate and not merely as explicitly set out in the claims.

Furthermore, one or more selected features of any one embodiment described in this disclosure may be combined with one or more selected features of any other embodiment described herein, provided that the alternative combination of features at least partially alleviates the one or more technical problem discussed in this disclosure or at least partially alleviates a technical problem discernable by the skilled person from this disclosure and further provided that the particular combination or permutation of embodiment features thus formed would not be understood by the skilled person to be incompatible.

Two or more physically distinct components in any described example implementation of this disclosure may alternatively be integrated into a single component where possible, provided that the same function is performed by the single component thus formed. Conversely, a single component of any embodiment described in this disclosure may alternatively be implemented as two or more distinct components to achieve the same function, where appropriate.

It is an aim of certain embodiments of the invention to solve, mitigate or obviate, at least partly, at least one of the problems and/or disadvantages associated with the prior art. Certain embodiments aim to provide at least one of the advantages described below.

Advantageous Effects of Invention

According to various embodiments, a conductive material of an EMI shielding layer can be blocked from the outside. Accordingly, electronic component that has not been separately insulated can be disposed at a location that is adjacent to the flexible flat cable.

Further, a corrosion problem of a conductive material that may be included in an EMI shielding layer can be solved by blocking the conductive material of the EMI shielding layer from the outside.

BRIEF DESCRIPTION OF DRAWINGS

Throughout the drawings, it should be noted that like reference numbers are used to depict the same or similar elements, features, and structures.

MODE FOR THE INVENTION

Figure 1:
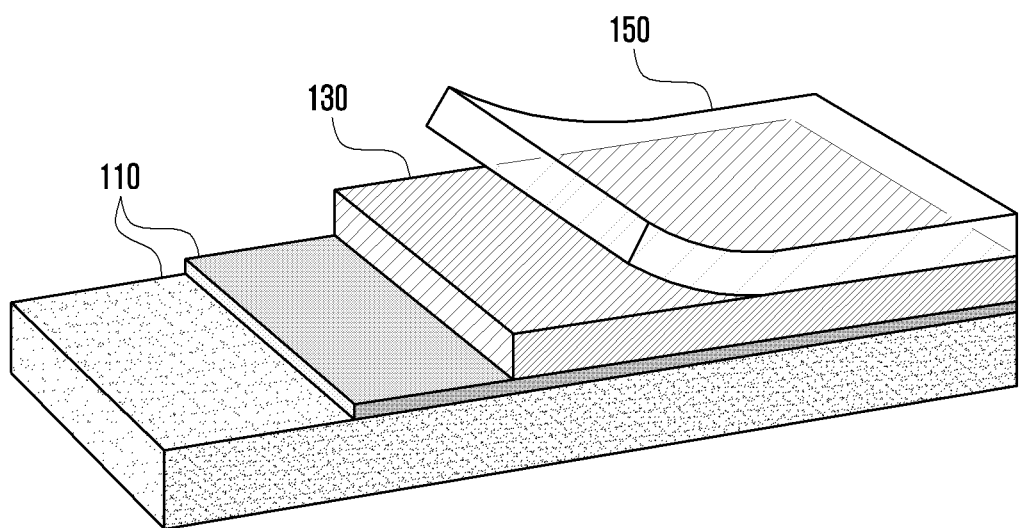
FIG. 1 is a view of a shield member according to an embodiment of the disclosure.

It should be appreciated that various embodiments of the disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

A shield unit may have a configuration of shielding electromagnetic interferences (EMIs). The shield unit may be a film having an EMI shielding function. In an embodiment of the disclosure, the shield unit, for example, may be a first shield member (e.g., 250 of FIG. 2) and a second shield member (e.g., 270 of FIG. 3A). The first shield member may include a first shield layer (e.g., 251 of FIG. 2) and a second shield layer (e.g., 252 of FIG. 2). The second shield member may include a third shield layer (e.g., 271 of FIG. 3A) and a fourth shield layer (e.g., 272 of FIG. 3A).

FIG. 1 is a view illustrating a configuration of a first shield member and a second shield member (hereinafter, shield members) included in a flexible flat cable according to an embodiment of the disclosure.

As illustrated in FIG. 1, the shield member may have a form in which a plurality of films are laminated. The shield member may include a shield layer 110, a protection layer 130, and a transport layer 150.

The shield layer 110 may shield electromagnetic interferences (EMIs). The shield layer 110 may be formed of various materials. For example, the shield layer 110 may be formed of a conductive material. According to occasions, the shield layer 110 may be formed of a material containing metal powder, and may show characteristics of being conductive anisotropically or isotropically. The shield layer 110 may be formed through a metal sputtering scheme. The shield layer 110 may be formed of a conductive bonding material having an adhesive property. The shield layer 110 may be formed in a form in which two or more materials are laminated. For example, the shield layer 110 may be formed in a form in which a mesh copper layer and a conductive bonding material are laminated.

The protection layer 130 may protect the shield layer 110. The protection layer 130 may be formed of an insulation material (e.g., a dielectric). The protection layer 130 may be formed in a form in which two or more materials are laminated.

The transport layer 150 may protect the shield member, and may be removed after the shield member is disposed. The transport layer 150 may be formed of a material, such as transport PET.

The above-described shield layer 110 may be a first shield layer 251 and a third shield layer 271 of the flexible flat cable according to various embodiments. The above-described protection layer 130 may be a second shield layer 252 and a fourth shield layer 272 of the flexible flat cable according to various embodiments.

As illustrated in FIG. 1, the shield layer 110 of the shield member may be exposed to the outside by cutting the shield member. For example, the shield layer 110 may be exposed to the outside on a side surface of the shield member.

Figure 2:
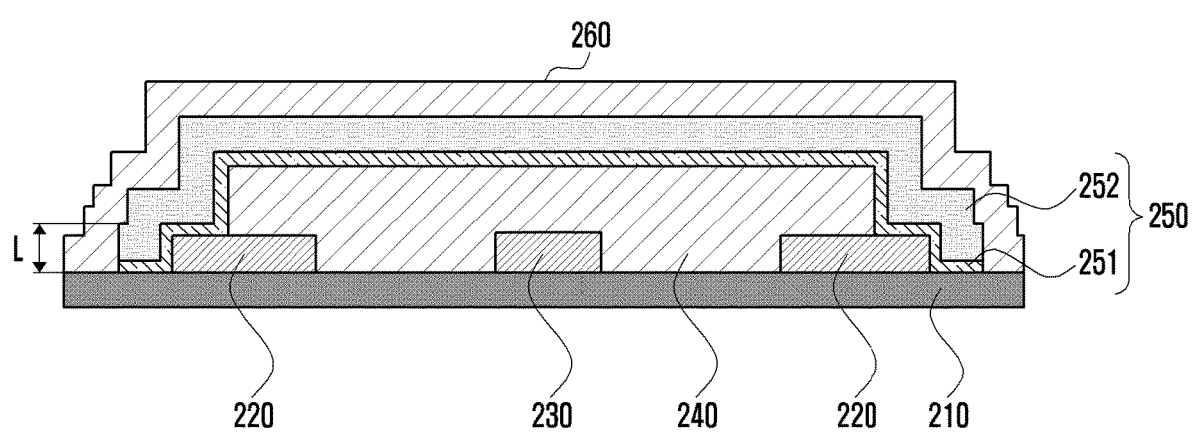
FIG. 2 is a cross-sectional view of a flexible flat cable according to an embodiment of the disclosure.

FIG. 2 is a cross-sectional view of a flexible flat cable according to an embodiment of the disclosure.

Referring to FIG. 2, a flexible flat cable according to various embodiments may include a first insulation layer 210, a first conductive pattern 220, a second conductive pattern 230, a second insulation layer 240, a first shield member 250, and a third insulation layer 260.

The first insulation layer 210 may have a plate shape. The first insulation layer 210 may support other configurations of the flexible flat cable. The other configurations may be disposed on the first insulation layer 210 to form the flexible flat cable. The first insulation layer 210 may be formed of a material having an insulation property. For example, the first insulation layer 210 may be formed of a dielectric.

The first conductive pattern 220 may be disposed on the first insulation layer 210. The first conductive pattern 220 may be formed of a conductive metal such that a current flows through the first conductive pattern 220. The first conductive pattern 220 may be formed by etching a portion of a copper thin layer disposed on the first insulation layer 210. As illustrated in FIG. 2, a plurality of first conductive patterns 220 may be provided on the first insulation layer 210 to be spaced apart from each other at a predetermined interval. The number of the first conductive patterns 220 may be variously changed if necessary. The first conductive pattern 220 may include at least one ground line. Hereinafter, it will be described that the first conductive pattern 220 is a ground line 220.

The second conductive pattern 230 may be disposed on the first insulation layer 210. The second conductive pattern 230 may be formed of a conductive metal such that a current flows through the second conductive pattern 230. The second conductive pattern 230 may be formed by etching a portion of a copper thin layer disposed on the first insulation layer 210. As illustrated in FIG. 2, the second conductive pattern 230 may be disposed to be spaced apart from the ground line 220 at a predetermined interval. Although FIG. 2 illustrates that one second conductive pattern 230 is provided, the number of the second conductive patterns 230 may be variously changed if necessary. For example, two second conductive patterns 230 may be provided. The second conductive pattern 230 may include at least one signal transmission line that transmits an electrical signal. Hereinafter, it will be described that the second conductive pattern 230 is a signal transmission line 230. The signal transmission line 230 may be used to transmit a low-speed signal or a high-speed signal. The low-speed signal may include at least one of an audio signal, a power signal, or a control signal. The high-speed signal may include a 5G communication signal, a Wi-Fi signal, an intermediate frequency (IF) signal, a Bluetooth signal, a USB signal, an HDMI signal, or an MIPI signal. In addition, the signal transmission line 230 may transmit various electrical signals.

The second insulation layer 240 may be formed of a material having an insulation property. For example, the second insulation layer 240 may be formed of a dielectric. The second insulation layer 240 may be disposed on the first insulation layer 210 to cover the ground line 220 and the signal transmission line 230. As illustrated in FIG. 2, the second insulation layer 240 may cover a portion of the ground line 220. According to various embodiments of the disclosure, the second insulation layer 240 may be disposed on the first insulation layer 210 to cover the entire ground line 220.

The first shield member 250 may include a first shield layer 251 and a second shield layer 252. As described above, the first shield layer 251 may be a conductive bonding material (e.g., the shield layer 110 of FIG. 1). The second shield layer 252 may be a protection layer (e.g., the protection layer 130 of FIG. 1) that protects the first shield layer 251.

As illustrated in FIG. 2, the first shield layer 251 may be disposed on the first insulation layer 210 and the second insulation layer 240 to cover the second insulation layer 240. As in FIG. 2, when the second insulation layer 240 is disposed to cover only a portion of the ground line 220, the first shield layer 251 may cover the ground line 220. The first shield layer 251, which is a conductive bonding material, and the ground line 220 may be electrically connected to each other. The first shield layer 251 having an EMI shielding property may shield the signal transmission line 230 while surrounding the ground line 220 and the signal transmission line 230. Accordingly, the signal transmission line 230 is in an EMI shielding state, and can prevent the signal transmitted to the signal transmission line 230 from being crossed.

The second shield layer 252 may be disposed on the first shield layer 251 to protect the first shield layer 251.

The third insulation layer 260 may be formed of a material having an insulation property. For example, the third insulation layer 260 may be formed of a dielectric. The third insulation layer 260 is disposed to surround the first shield member 250. Referring to FIG. 2, in a state in which the third insulation layer 260 surrounds the first shield member 250, the third insulation layer 260 covers the first shield layer 251 exposed between the first insulation layer 210 and the second shield layer 252 of the first shield member 250. For example, the third insulation layer 260 blocks the first shield layer 251 from the outside such that the first shield layer 251 is not exposed to the outside.

The flexible flat cable of the related art is configured such that the shield member that performs the EMI shielding function is disposed on the outermost side. If the outer shape of the flexible flat cable is cut, the conductive shield layer is exposed to the outside at a cross-sectional portion thereof. A design of disposing electronic components at a portion at which the shield layer is exposed, and an adjacent portion thereof is limited. This is because a short-circuit is caused between the shield layer and the electronic components. In the of the related art technology, at a side portion of the flexible flat cable and an adjacent portion thereof, an electronic component is not disposed, electronic components are disposed at a predetermined interval even though they are disposed, or a separate insulation process (e.g., a shielding can or an insulation tape) is necessary in an electronic component or the flexible flat cable. Due to the limitation, the arrangement of the electronic components is inefficiently designed, and costs increase due to a separate insulation process. According to occasions, the shield layer exposed to the outside may contact moisture, causing corrosion of the shield layer.

Because the flexible flat cable according to various embodiments is configured to block the first shield layer 251 from the outside, the above problems can be effectively solved. For example, in the flexible flat cable according to various embodiments of the disclosure, the arrangement of the electronic components is not limited due to the concern about a short-circuit. If necessary, the flexible flat cable may be disposed in a form in which the flexible flat cable and the electronic components contact each other in some sections. Because a separate insulation process is not necessary as the concern about a short-circuit between the flexible flat cable and the electronic components is not present. Because the first shield layer 251 is blocked from the outside, a problem of the first shield layer 251 corroding by the moisture introduced from the outside can be effectively solved.

Hereinafter, a lamination structure of the first shield member 250 and the third insulation layer 260 will be described below.

According to various embodiments of the disclosure, as illustrated in FIG. 2, opposite side ends of the first shield member 250 may be disposed to be spaced apart from opposite side ends of the first insulation layer 210. The opposite side ends of the first shield member 250 may be disposed to be closer to the center of the flexible flat cable than to the opposite ends of the first insulation layer 210. For example, the opposite ends of the first shield member 250 may be disposed on the inner sides of the opposite side ends of the first insulation layer 210.

The third insulation layer 260 may be disposed on the first insulation layer 210 to be filled between the opposite ends of the first shield member 250 and the opposite ends of the first insulation layer 210. In this state, a portion of the third insulation layer 260, which contacts the first insulation layer 210, may cover a side portion L of the first shield member 250. As described above, the side portion L of the first shield member 250 is a portion, at which the first shield layer 251 is exposed to the outside. The flexible flat cable according to various embodiments may block the first shield layer 251 from the outside as the third insulation layer 260 covers the side portion L of the first shield member 250.

Although it has been described above that the third insulation layer 260 covers the opposite side surfaces of the first shield member 250, the third insulation layer 260 may be disposed on the first insulation layer 210 to cover only one of the opposite side surfaces of the first shield member 250. A portion of the end of the first shield member 250 may coincide with the location of a portion of an end of the first insulation layer 210.

Figure 3A:
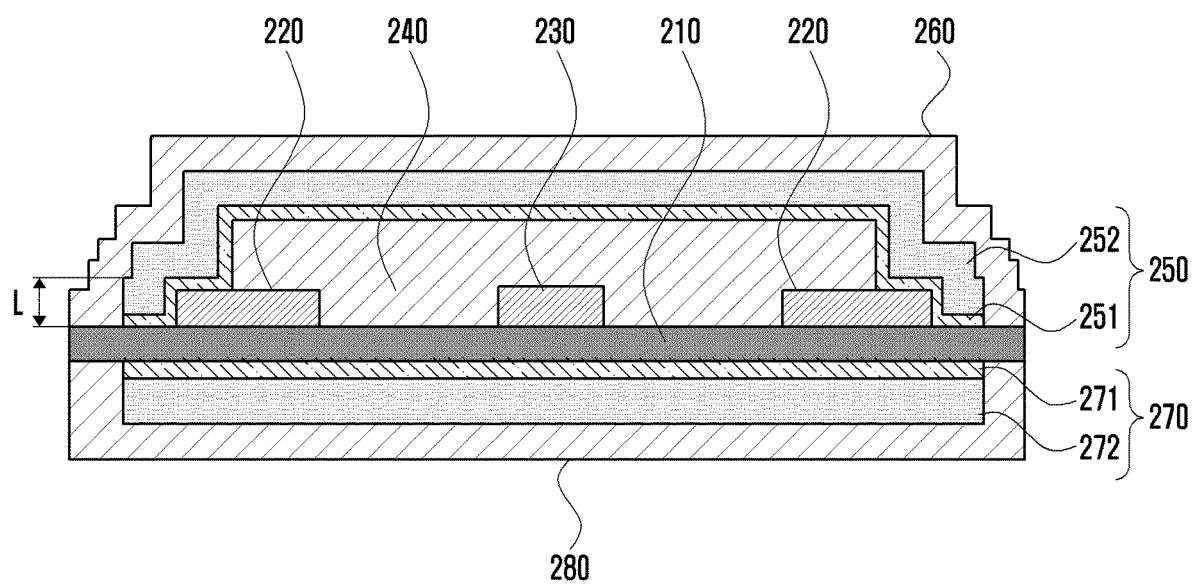
FIG. 3A is a cross-sectional view of a flexible flat cable according to an embodiment of the disclosure.

FIG. 3A is a cross-sectional view of a flexible flat cable according to an embodiment of the disclosure.

FIG. 3A is a view of a flexible flat cable in a form in which an EMI shielding structure is applied to the opposite surfaces of the first insulation layer 210. The first insulation layer 210 having a plate shape may include a first surface and a second surface corresponding to an opposite surface to the first surface. The configurations disposed on the first surface of the first insulation layer 210 are the same as those of the above-described embodiments of the disclosure, and the configurations disposed on the second surface of the first insulation layer 210 will be described.

A second shield member 270 and a fourth insulation layer 280 may be disposed on the second surface of the first insulation layer 210.

The second shield member 270 may include a third shield layer 271 and a fourth shield layer 272. The third shield layer 271 may have a configuration that is similar to that of the above-described first shield layer 251. The third shield layer 271 may be formed of a conductive material that shields EMIs. For example, the third shield layer 271 may be a conductive bonding material (e.g., the shield layer 110 of FIG. 1). The third conductive layer 271 may be disposed on the second surface of the first insulation layer 210. The fourth shield layer 272 may have a configuration that is similar to that of the above-described second shield layer 252. The fourth shield layer 272 may be a protection layer (e.g., the protection layer 130 of FIG. 1) that protects the third shield layer 271.

The fourth insulation layer 280 may be formed of a material having an insulation property. For example, the fourth insulation layer 280 may be formed of a dielectric. The fourth insulation layer 280 may be disposed to surround the second shield member 270 and may cover the third shield layer 271 exposed between the fourth shield layer 272 and the first insulation layer 210.

As illustrated in FIG. 3A, opposite side ends of the second shield member 270 may be disposed to be spaced apart from opposite side ends of the first insulation layer 210. The opposite side ends of the second shield member 270 may be disposed to be closer to the center of the flexible flat cable than to the opposite ends of the first insulation layer 210.

The fourth insulation layer 280 may be disposed on the first insulation layer 210 to be filled between the opposite ends of the second shield member 270 and the opposite ends of the first insulation layer 210. Accordingly, the fourth insulation layer 280 may cover the side portion L of the second shield member 270. The fourth insulation layer 280 may block the third shield layer 271 of the second shield member 270 from the outside by covering the side portion L of the second shield member 270.

Although it has been described above that the fourth insulation layer 280 covers the opposite side surfaces of the second shield member 270, the fourth insulation layer 280 may be disposed on the first insulation layer 210 to cover only one of the opposite side surfaces of the second shield member 270. A portion of the end of the second shield member 270 may coincide with the location of a portion of an end of the first insulation layer 210.

Figure 3B:
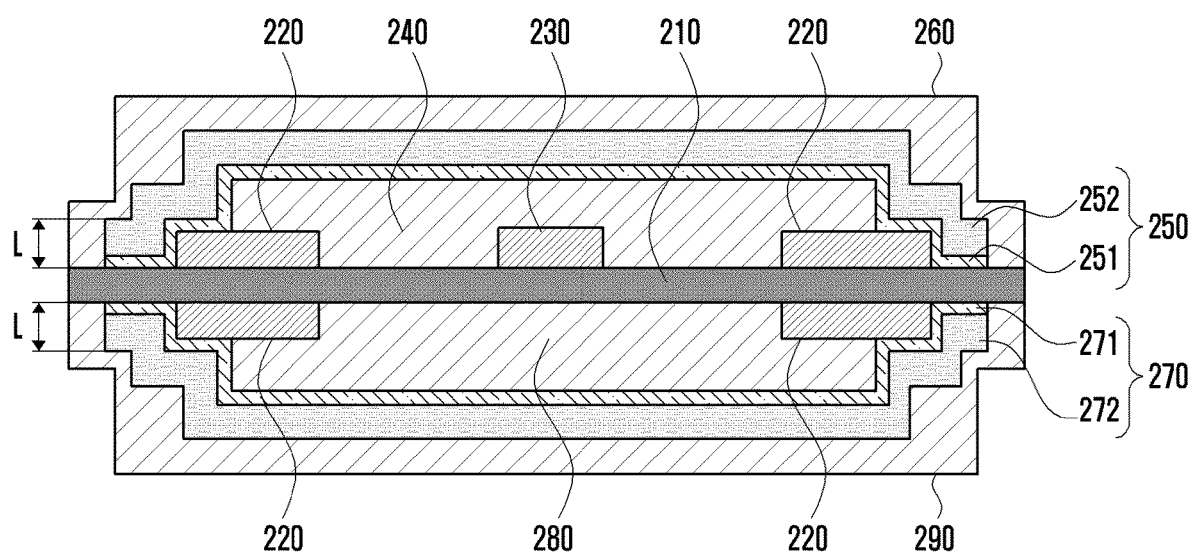
FIG. 3B is a cross-sectional view of a flexible flat cable according to an embodiment of the disclosure.

FIG. 3B is a cross-sectional view of a flexible flat cable according to an embodiment of the disclosure.

FIG. 3B is a view of a flexible flat cable in a form in which an EMI shielding structure is applied to the opposite surfaces of the first insulation layer 210. The first insulation layer 210 having a plate shape may include a first surface and a second surface corresponding to an opposite surface to the first surface. The configurations disposed on the first surface of the first insulation layer 210 are the same as those of the above-described embodiments of the disclosure, and the configurations disposed on the second surface of the first insulation layer 210 will be described.

In the flexible flat cable according to the embodiment of the disclosure, the configurations may be laminated while the second surface of the first insulation layer 210 is similar to the first surface thereof. However, as illustrated in FIG. 3B, a signal transmission line 230 disposed on the first surface may be omitted in the second surface of the first insulation layer 210. A ground line 220 may be disposed on the second surface of the first insulation layer 210. A fourth insulation layer 280 may be disposed on the second surface of the first insulation layer 210 to cover a portion of the ground line 220.

As illustrated in FIG. 3B, opposite side ends of the second shield member 270 may be disposed to be spaced apart from opposite side ends of the first insulation layer 210. The opposite side ends of the second shield member 270 may be disposed to be closer to the center of the flexible flat cable than to the opposite ends of the first insulation layer 210.

The fifth insulation layer 290 may be disposed on the first insulation layer 210 to be filled between the opposite ends of the second shield member 270 and the opposite ends of the first insulation layer 210. Accordingly, the fifth insulation layer 290 may cover the side portion L of the second shield member 270. The fifth insulation layer 290 may block the third shield layer 271 of the second shield member 270 from the outside by covering the side portion L of the second shield member 270.

Figure 4:
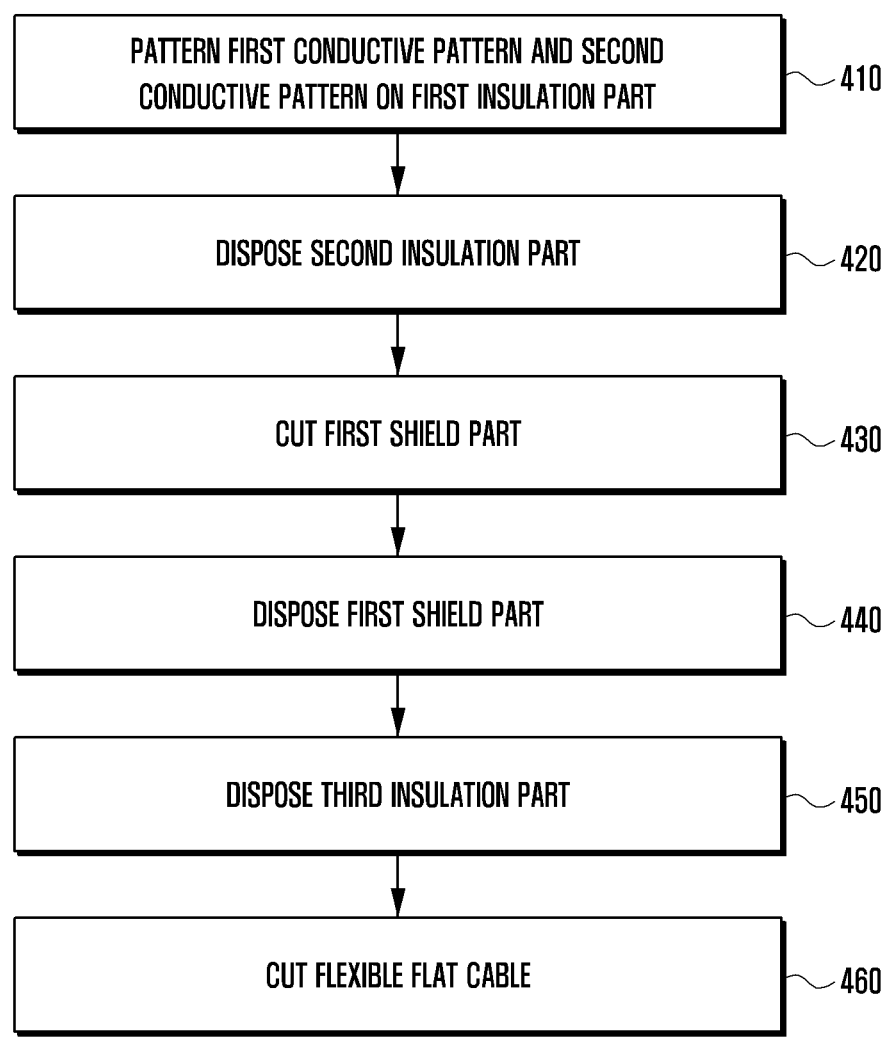
FIG. 4 is a flowchart of a manufacturing method according to an embodiment of the disclosure.
Figure 5:
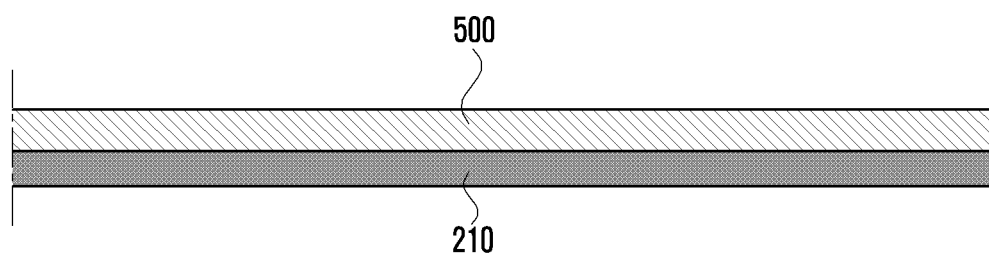
FIG. 5 is a view illustrating a manufacturing method according to an embodiment of the disclosure.
Figure 6:
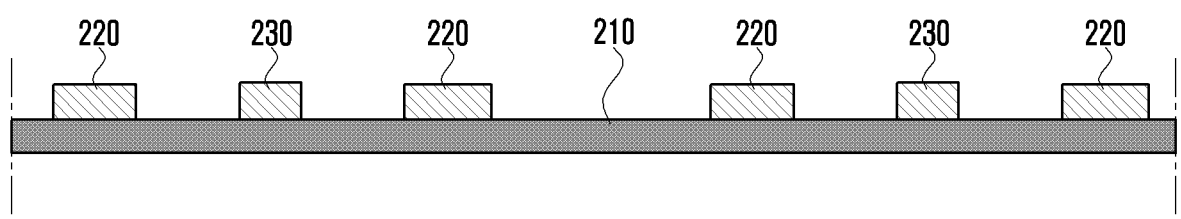
FIG. 6 is a view illustrating a manufacturing method according to an embodiment of the disclosure.
Figure 7:
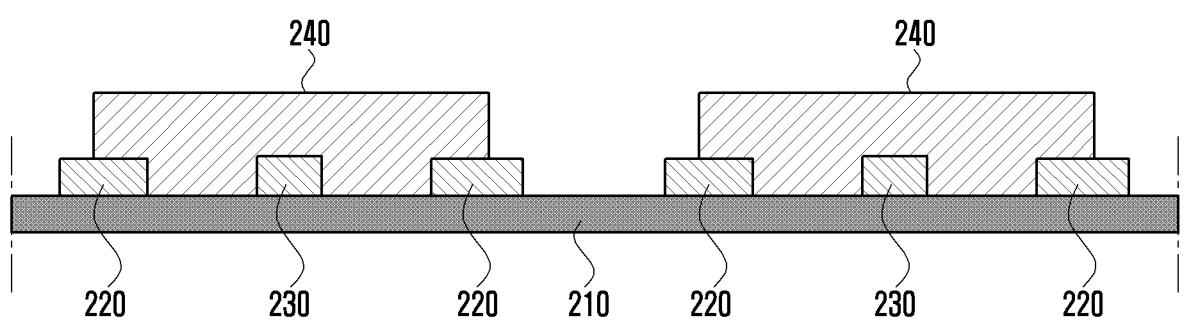
FIG. 7 is a view illustrating a manufacturing method according to an embodiment of the disclosure.
Figure 8:
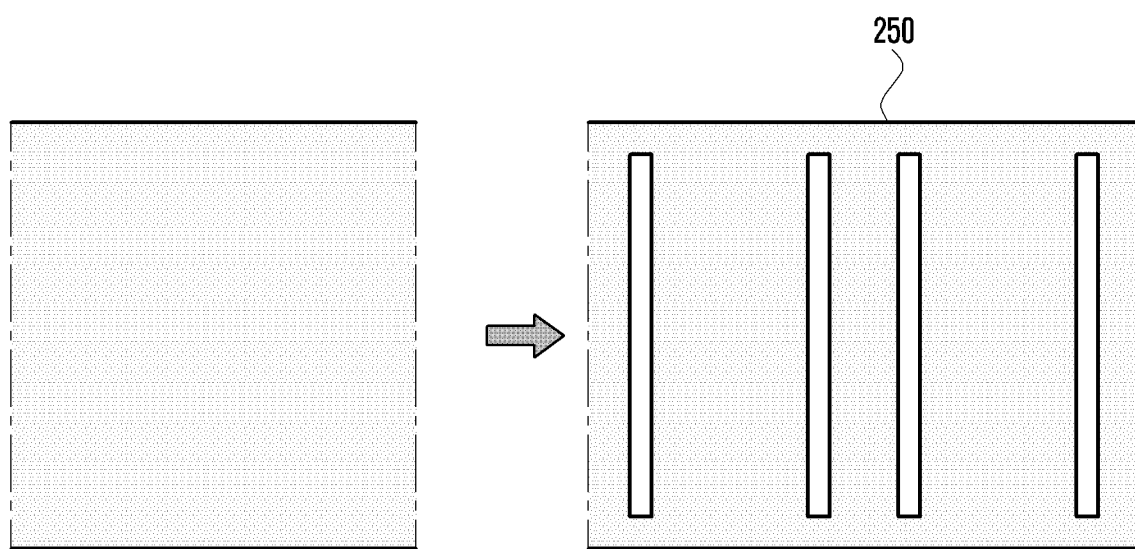
FIG. 8 is a view illustrating a manufacturing method according to an embodiment of the disclosure.
Figure 9:
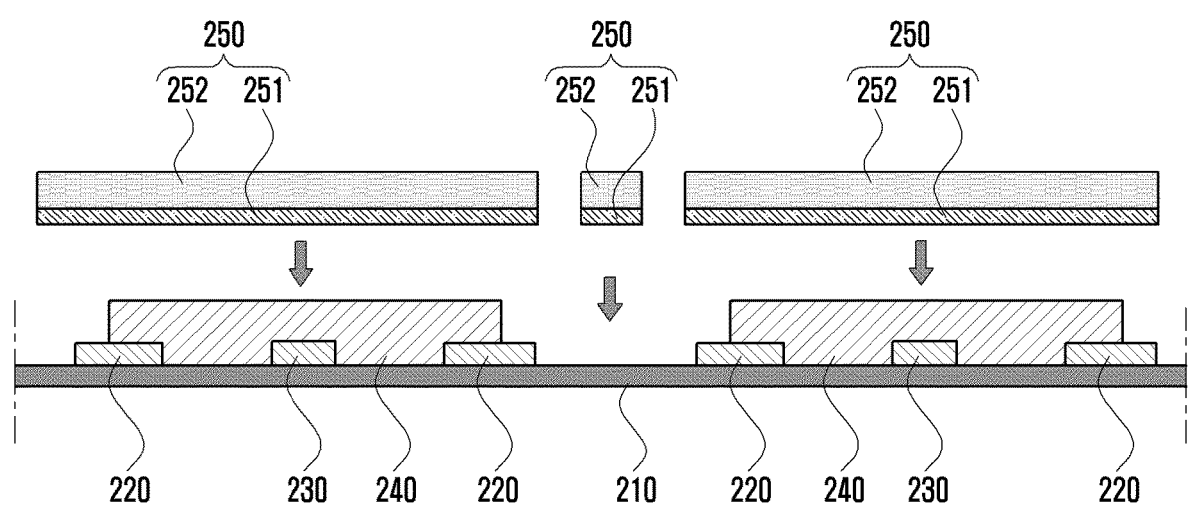
FIG. 9 is a view illustrating a manufacturing method according to an embodiment of the disclosure.
Figure 10:
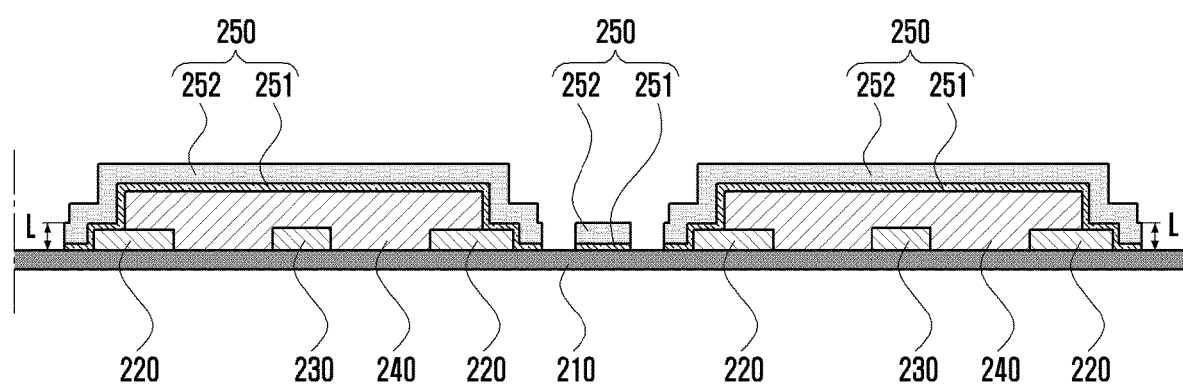
FIG. 10 is a view illustrating a manufacturing method according to an embodiment of the disclosure.
Figure 11:
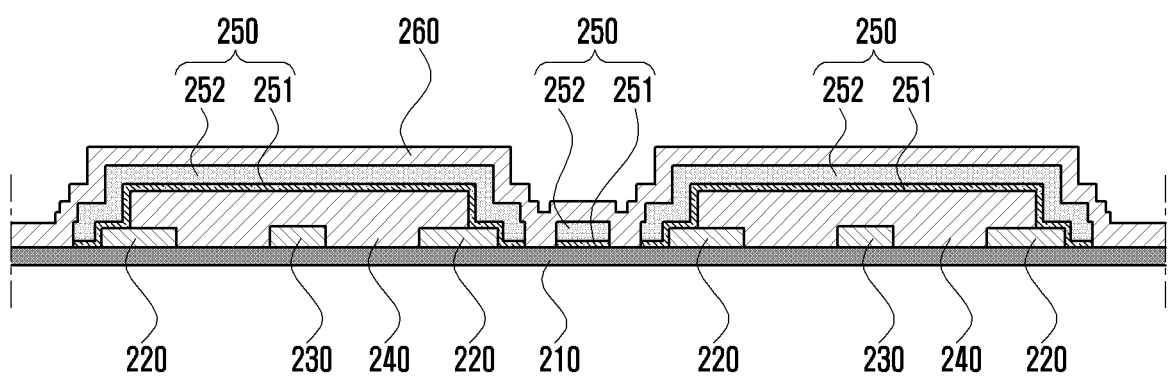
FIG. 11 is a view illustrating a manufacturing method according to an embodiment of the disclosure.
Figure 12:
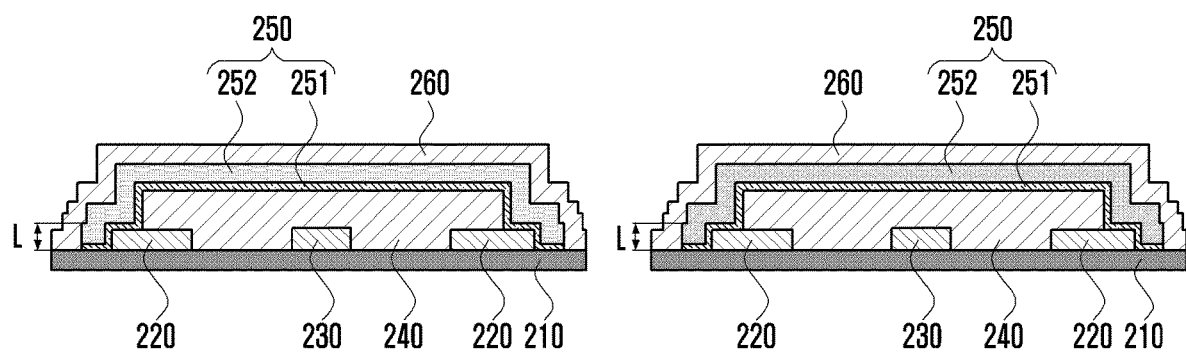
FIG. 12 is a view illustrating a manufacturing method according to an embodiment of the disclosure.

FIG. 4 is a flowchart of a manufacturing method according to an embodiment of the disclosure. FIG. 5 is a view illustrating a manufacturing method according to an embodiment of the disclosure. FIG. 6 is a view illustrating a manufacturing method according to an embodiment of the disclosure. FIG. 7 is a view illustrating a manufacturing method according to an embodiment of the disclosure. FIG. 8 is a view illustrating a manufacturing method according to an embodiment of the disclosure. FIG. 9 is a view illustrating a manufacturing method according to an embodiment of the disclosure. FIG. 10 is a view illustrating a manufacturing method according to an embodiment of the disclosure. FIG. 11 is a view illustrating a manufacturing method according to an embodiment of the disclosure. FIG. 12 is a view illustrating a manufacturing method according to an embodiment of the disclosure.

Hereinafter, a method of manufacturing a flexible flat cable according to various embodiments will be described with reference to FIGS. 4 to 12. FIGS. 4 to 12 illustrate only a process of manufacturing two flexible flat cables for convenience of description. An interval between the two flexible flat cables illustrated in FIGS. 4 to 12 are exaggerated for convenience of description.

First, a first conductive pattern 220 and a second conductive pattern 230 may be patterned on the first insulation layer 210 in operation 410. The first conductive pattern 220 may include at least one ground line, and the second conductive pattern 230 may include at least one signal transmission line 230. Hereinafter, it will be described that the first conductive pattern 220 is a ground line 220 and the second conductive pattern 230 is a signal transmission line 230. The ground line 220 and the signal transmission line 230 may be patterned in various methods.

For example, as illustrated in FIG. 5, the ground line 220 and the signal transmission line 230 may be patterned by etching the first insulation layer 210, in which a conductor 500 is disposed. The conductor 500 disposed on the first insulation layer 210 may be a copper thin layer. According to occasions, the ground line 220 and the signal transmission line 230 may be patterned on the first insulation layer by using a printing technique. In this way, the ground line 220 and the signal transmission line 230 may be patterned by using various methods as illustrated in FIG. 6.

Next, as illustrated in FIG. 7, the second insulation layer 240 may be disposed on the first insulation layer 210 such that at least a portion of the ground line 220 and the signal transmission line 230 are covered (operation 420. The second insulation layer 240 may cover the entire ground line 220, and as illustrated in FIG. 7, the second insulation layer 240 may cover only a portion of the ground line 220.

In this state, the first shield layer 250 may be disposed on the first insulation layer 210 and the second insulation layer 240 such that the first shield member 250 covers the ground line 220 and the second insulation layer 240 in operation 440. After a portion of the first shield member 250 is cut, the cut first shield member 250 may be disposed on the first insulation layer 210 and the second insulation layer 240. A portion of the first shield member 250 may be cut such that the opposite side ends of the first shield member 250 may be disposed to be closer to the center of the flexible flat cable than to the opposite ends of the first insulation layer 210 in operation 430.

Referring to FIG. 8, a slit-shaped groove may be formed at the cut portion of the first shield member 250. If the first shield member 250 cut in this way is disposed on the first insulation layer 210 and the second insulation layer 240 through the process illustrated in FIG. 9, as illustrated in FIG. 10, the opposite side ends of the first shield member 250 may be disposed to be spaced apart from the first insulation layer 210 at a predetermined interval.

In this state, a third insulation layer 260 may be disposed on the first shield member 250 and the first insulation layer 210 in operation 450.

As illustrated in FIG. 11, the third insulation layer 260 disposed on the first insulation layer 210 may be filled between an end of the first shield member 250 and an end of the first insulation layer 210. Accordingly, the first shield layer 251 of the first shield member 250 may be blocked from the outside by the third insulation layer 260.

Next, as illustrated in FIG. 12, the process of manufacturing the flexible flat cable may be ended by cutting the outer shape of the flexible flat cable (460).

According to occasions, before the outer shape of the flexible flat cable is cut, a process of disposing the second shield member 270 and a fourth insulation layer 280 on the second surface of the first insulation layer 210 may be additionally performed.

First, a process of disposing the second shield member 270 will be described. The second shield member 270 may be disposed on the second surface of the first insulation layer 210. Similarly to the above-described first shield member 250, the second shield member 270 may be disposed on the first insulation layer 210 after the opposite ends of the second shield member 270 are cut. The opposite side ends of the second shield member 270 may be disposed to be closer to the center of the flexible flat cable than to the opposite ends of the first insulation layer 210.

Next, a process of disposing the fourth shield member 280 will be described. The fourth insulation layer 280 may be disposed on the second shield member 270 and the first insulation layer 210. Similarly to the above-described third insulation layer 260, the fourth insulation layer 280 may be filled between an end of the second shield member 270 and an end of the first insulation layer 210. Accordingly, the third shield layer 271 of the second shield member 270 may be blocked from the outside by the fourth insulation layer 280.

A flexible flat cable according to a first embodiment of the disclosure may include a first insulation layer having a plate shape, a first conductive pattern disposed on the first insulation layer, a second conductive pattern disposed on the first insulation layer to be spaced apart from the first conductive pattern at a predetermined interval, a second insulation layer covering at least a portion of the first conductive pattern and disposed on the first insulation layer to cover the second conductive pattern, a first shield unit including a first shield layer disposed on the first insulation layer and the second insulation layer to cover the first conductive pattern and the second conductive pattern, and a second shield layer disposed on the first shield layer to cover the first shield layer, and a third insulation layer surrounding the first shield layer such that at least a portion of the first shield layer of the first shield unit, which is exposed between the first insulation layer and the second shield layer of the first shield unit is covered.

According to a flexible flat cable according to a second embodiment of the disclosure, in the flexible flat cable of the first embodiment or other embodiments of the disclosure, wherein the first conductive pattern includes at least one ground line.

According to a flexible flat cable according to a third embodiment of the disclosure, in the flexible flat cable of the first or second embodiment or other embodiments of the disclosure, the second conductive pattern may include at least one signal transmission line that transmits an electrical signal.

According to a flexible flat cable according to a fourth embodiment of the disclosure, in the flexible flat cable of the first to third embodiments or other embodiments of the disclosure, the first shield member may be configured such that at least a portion of an end of the first shield member is disposed to be spaced apart from an end of the first insulation layer at a predetermined interval and at least a portion of the end of the first shield member is disposed to be closer to the center of the flexible flat cable than to an end of the first insulation layer.

According to a flexible flat cable according to a fifth embodiment of the disclosure, in the flexible flat cable of the first to fourth embodiments or other embodiments of the disclosure, the third insulation layer may be disposed on the first insulation layer to fill a space between the end of the first shield member and the end of the first insulation layer to block the first shield layer of the first shield member, which is exposed between the first insulation layer and the second shield layer of the first shield member from the outside.

According to a flexible flat cable according to a sixth embodiment of the disclosure, in the flexible flat cable of the first to fifth embodiments or other embodiments of the disclosure, the first shield layer of the first shield member may be formed of a conductive material, and the first shield layer of the first shield member may be electrically connected to the first conductive pattern.

According to a flexible flat cable according to a seventh embodiment of the disclosure, in the flexible flat cable of the first to sixth embodiments or other embodiments of the disclosure, the first shield layer of the first shield unit may be formed of a conductive bonding material.

According to a flexible flat cable according to an eighth embodiment of the disclosure, in the flexible flat cable of the first to seventh embodiments or other embodiments of the disclosure, the first insulation layer may include a first surface, on which the first conductive pattern and the second conductive pattern are disposed, and a second surface corresponding to an opposite surface to the first surface, and the flexile flat cable may further include a second shield unit including a third shield layer disposed on the second surface of the first insulation layer and a fourth shield layer disposed on the third shield layer, and a fourth insulation layer surrounding the second shield unit such that at least a portion of the third shield layer of the second shield unit, which is exposed between the first insulation layer and the fourth shield layer of the second shield layer is covered.

According to a flexible flat cable according to a ninth embodiment of the disclosure, in the flexible flat cable of the eighth embodiment or other embodiments of the disclosure, the second shield unit may be configured such that at least a portion of an end of the second shield unit is disposed to be spaced apart from an end of the first insulation layer at a predetermined interval and at least a portion of the end of the second shield unit is disposed to be closer to the center of the flexible flat cable than to an end of the first insulation layer.

According to a flexible flat cable according to a tenth embodiment of the disclosure, in the flexible flat cable of the eighth or ninth embodiments or other embodiments of the disclosure, the fourth insulation layer may be disposed on the first insulation layer to fill a space between the end of the second shield unit and the end of the first insulation layer to block the third shield layer of the second shield unit, which is exposed between the first insulation layer and the fourth shield layer of the second shield unit from the outside.

According to a flexible flat cable according to an eleventh embodiment of the disclosure, in the flexible flat cable of the eighth to tenth embodiments or other embodiments of the disclosure, the third shield layer of the second shield unit may be formed of a conductive bonding material.

A method of manufacturing a flexible flat cable according to a first embodiment of the disclosure may include pattering at least one first conductive pattern and at least one second conductive pattern on a first insulation layer having a plate shape, disposing a second insulation layer on the first insulation layer such that at least a portion of the first conductive pattern and the second conductive pattern are covered, disposing the first shield unit on the first insulation layer and the second insulation layer such that a first shield unit including a first shield layer and a second shield layer covers the first conductive pattern and the second insulation layer, disposing a third insulation layer on the first shield unit and the first insulation layer such that at least a portion of the first shield layer of the first shield unit, which is exposed between the first insulation layer and the second shield layer of the first shield unit is covered, and cutting an outer shape of the flexible flat cable.

According to a method according to a second embodiment of the disclosure, in the method of the first embodiment or other embodiments of the disclosure, the disposing of the first shield unit may include cutting a portion of the first shield unit such that at least a portion of an end of the first shield unit is disposed to be spaced apart from an end of the first insulation layer at a predetermined interval and at least a portion of the end of the first shield unit is disposed to be closer to the center of the flexible flat cable than to an end of the first insulation layer.

According to a method according to a third embodiment of the disclosure, in the method of the first or second embodiment or other embodiments of the disclosure, the disposing of the third shield unit may include disposing the third insulation layer on the first insulation layer to fill the third insulation layer in a space between an end of the first shield unit and an end of the first insulation layer such that the first shield layer of the first shield unit, which is exposed between the first insulation layer and the second shield layer of the first shield layer, is blocked from the outside.

According to a method according to a fourth embodiment of the disclosure, in the method of the first to third embodiments or other embodiments of the disclosure, the first shield layer of the first shield unit may be formed of a conductive material, and the first shield layer of the first shield unit may be disposed to be electrically connected to the first conductive pattern.

According to a method according to a fifth embodiment of the disclosure, in the method of the first to fourth embodiments or other embodiments of the disclosure, the first shield layer of the first shield unit may be formed of a conductive bonding material.

According to a method according to a sixth embodiment of the disclosure, in the method of the first to fifth embodiment or other embodiments of the disclosure, the first insulation layer may include a first surface, on which the first conductive pattern and the second conductive pattern are disposed, and a second surface corresponding to an opposite surface to the first surface, the method may further include disposing a second shield unit including a third shield layer and a fourth shield layer disposed on the third shield layer on the second surface of the first insulation layer, and disposing a fourth insulation layer on the second shield unit and the first insulation layer such that at least a portion of the third shield layer of the second shield unit, which is exposed between the first insulation layer and the third shield layer of the second shield unit, is covered.

According to a method according to a seventh embodiment of the disclosure, in the method of the sixth embodiment or other embodiments of the disclosure, the disposing of the second shield unit may include cutting a portion of the second shield unit such that at least a portion of an end of the second shield unit is disposed to be spaced apart from an end of the first insulation layer at a predetermined interval and at least a portion of the end of the second shield unit is disposed to be closer to the center of the flexible flat cable than to an end of the first insulation layer.

According to a method according to an eighth embodiment of the disclosure, in the method of the sixth or seventh embodiment or other embodiments of the disclosure, the disposing of the fourth shield unit may include disposing the fourth insulation layer on the first insulation layer to fill the fourth insulation layer in a space between an end of the second shield unit and an end of the first insulation layer such that the third shield layer of the second shield unit, which is exposed between the first insulation layer and the fourth shield layer of the second shield layer, is blocked from the outside.

According to a method according to a ninth embodiment of the disclosure, in the method of the sixth to eighth embodiments or other embodiments of the disclosure, the third shield layer of the second shield unit may be formed of a conductive bonding material.

The embodiments disclosed in the disclosure disclosed in the specification and the drawings simply suggest specific examples to easily describe the technical contents according to the embodiments disclosed in the disclosure and help understanding of the embodiments disclosed in the disclosure, and are not intended to limit the scopes of the embodiments disclosed in the disclosure. Accordingly, it should be construed that the scopes of the various embodiments disclosed in the disclosure include all changes or modifications deduced based on the technical spirits of the various embodiments disclosed in the disclosure, in addition to the embodiments disclosed herein.

The scope of protection is defined by the appended independent claims. Further features are specified by the appended dependent claims. Example implementations can be realized comprising one or more features of any claim taken jointly and severally in any and all permutations.

The examples described in this disclosure include non-limiting example implementations of components corresponding to one or more features specified by the appended independent claims and these features (or their corresponding components) either individually or in combination may contribute to ameliorating one or more technical problems deducible by the skilled person from this disclosure.

Furthermore, one or more selected component of any one example described in this disclosure may be combined with one or more selected component of any other one or more example described in this disclosure, or alternatively may be combined with features of an appended independent claim to form a further alternative example.

Further example implementations can be realized comprising one or more components of any herein described implementation taken jointly and severally in any and all permutations. Yet further example implementations may also be realized by combining features of one or more of the appended claims with one or more selected components of any example implementation described herein.

In forming such further example implementations, some components of any example implementation described in this disclosure may be omitted. The one or more components that may be omitted are those components that the skilled person would directly and unambiguously recognize as being not, as such, indispensable for the function of the present technique in the light of a technical problem discernible from this disclosure. The skilled person would recognize that replacement or removal of such an omitted components does not require modification of other components or features of the further alternative example to compensate for the change. Thus further example implementations may be included, according to the present technique, even if the selected combination of features and/or components is not specifically recited in this disclosure.

Two or more physically distinct components in any described example implementation of this disclosure may alternatively be integrated into a single component where possible, provided that the same function is performed by the single component thus formed. Conversely, a single component of any example implementation described in this disclosure may alternatively be implemented as two or more distinct components to achieve the same function, where appropriate.

The invention claimed is:
1. A flexible flat cable comprising:
  a first insulation layer having a plate shape;
  a first conductive pattern disposed on the first insulation layer;
  a second conductive pattern disposed on the first insulation layer to be spaced apart from the first conductive pattern at a predetermined interval;
  a second insulation layer covering at least a portion of the first conductive pattern and disposed on the first insulation layer to cover the second conductive pattern;
  a first shield member comprising a first shield layer disposed on the first insulation layer and the second insulation layer to cover the first conductive pattern and the second insulation layer, and a second shield layer disposed on the first shield layer to cover the first shield layer; and
  a third insulation layer surrounding the first shield layer such that at least a portion of the first shield layer of the first shield member, which is exposed between the first insulation layer and the second shield layer of the first shield member is covered,
  wherein the first insulation layer comprises a first surface, on which the first conductive pattern and the second conductive pattern are disposed, and a second surface corresponding to an opposite surface to the first surface, and
  wherein the flexible flat cable further comprises:
    a second shield member comprising a third shield layer disposed on the second surface of the first insulation layer and a fourth shield layer disposed on the third shield layer, and
    a fourth insulation layer surrounding the second shield layer such that at least a portion of the third shield layer of the second shield member, which is exposed between the first insulation layer and the fourth shield layer of the second shield layer is covered.

2. The flexible flat cable of claim 1, wherein the first conductive pattern comprises at least one ground line.

3. The flexible flat cable of claim 2, wherein the second conductive pattern comprises at least one signal transmission line that transmits an electrical signal.

4. The flexible flat cable of claim 3, wherein the first shield member is configured such that at least a portion of an end of the first shield member is disposed to be spaced apart from an end of the first insulation layer at a predetermined interval and at least a portion of the end of the first shield member is disposed to be closer to the center of the flexible flat cable than to an end of the first insulation layer.

5. The flexible flat cable of claim 4, wherein the third insulation layer is disposed on the first insulation layer to fill a space between the end of the first shield member and the end of the first insulation layer to block the first shield layer of the first shield member, which is exposed between the first insulation layer and the second shield layer of the first shield member from outside.

6. The flexible flat cable of claim 5,
  wherein the first shield layer of the first shield member is formed of a conductive material, and
  wherein the first shield layer of the first shield member is electrically connected to the first conductive pattern.

7. The flexible flat cable of claim 6, wherein the first shield layer of the first shield member is formed of a conductive bonding material.

8. The flexible flat cable of claim 6, wherein the second shield member is configured such that at least a portion of an end of the second shield member is disposed to be spaced apart from an end of the first insulation layer at a predetermined interval and at least a portion of the end of the second shield member is disposed to be closer to the center of the flexible flat cable than to an end of the first insulation layer.

9. The flexible flat cable of claim 8, wherein the fourth insulation layer is disposed on the first insulation layer to fill a space between the end of the second shield member and the end of the first insulation layer to block the third shield layer of the second shield member, which is exposed between the first insulation layer and the fourth shield layer of the second shield member from the outside.

10. The flexible flat cable of claim 9, wherein the third shield layer of the second shield member is formed of a conductive bonding material.

\* \* \* \* \*